(12) United States Patent
Abe et al.

(10) Patent No.: US 11,404,239 B2
(45) Date of Patent: Aug. 2, 2022

(54) SAMPLE PLATE HOLDER

(71) Applicant: JEOL Ltd., Tokyo (JP)

(72) Inventors: Akira Abe, Tokyo (JP); Yuta Murakami, Tokyo (JP); Shuhei Abe, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/012,378

(22) Filed: Sep. 4, 2020

(65) Prior Publication Data

US 2021/0074507 A1 Mar. 11, 2021

(30) Foreign Application Priority Data

Sep. 5, 2019 (JP) .............................. JP2019-162089

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01)

(58) Field of Classification Search
None
See application file for complete search history.

(56) References Cited

U.S. PATENT DOCUMENTS

| | | | |
|---|---|---|---|
| 5,781,337 A | 7/1998 | Pfeifer | |
| 2007/0131873 A1* | 6/2007 | Allred | H01J 37/20 250/440.11 |
| 2008/0296518 A1* | 12/2008 | Xu | H01J 5/18 250/505.1 |
| 2012/0119084 A1* | 5/2012 | Shaapur | H01J 37/20 250/307 |
| 2015/0303027 A1 | 10/2015 | Kobayashi et al. | |
| 2019/0258046 A1 | 8/2019 | Gallagher-Gruber et al. | |

FOREIGN PATENT DOCUMENTS

| | | | | |
|---|---|---|---|---|
| EP | 2458616 A2 | * | 5/2012 | ............. H01J 37/20 |
| EP | 2458616 A3 | * | 11/2013 | ............. H01J 37/20 |
| EP | 2771665 | | 9/2014 | |
| EP | 2771665 A1 | * | 9/2014 | ............. H01J 37/16 |
| EP | 2771665 A4 | * | 1/2016 | ............. H01J 37/16 |
| EP | 2771665 B1 | * | 8/2017 | ............. H01J 37/20 |
| EP | 2458616 B1 | * | 3/2018 | ............. H01J 37/20 |
| JP | 08254511 A | * | 10/1996 | |
| JP | 8254511 A | | 10/1996 | |
| JP | 9102293 A | | 4/1997 | |
| JP | 09102293 A | * | 4/1997 | |
| JP | 10507284 A | | 7/1998 | |
| JP | 1135151 A | | 2/1999 | |

(Continued)

OTHER PUBLICATIONS

Extended European Search Report issued in EP20193454.4 dated Jan. 28, 2021.
Office Action issued in JP2019162089 dated May 25, 2021.

*Primary Examiner* — Andrew Smyth
(74) *Attorney, Agent, or Firm* — The Webb Law Firm

(57) ABSTRACT

A first spring array and a second spring array are provided in a holder body. Three sample plates can be mounted in the holder body. On each sample plate, pressing-up forces from the first spring array and the second spring array are applied, but upward movement of each sample plate is restricted by an inner surface of a cover.

10 Claims, 8 Drawing Sheets

(56) References Cited

FOREIGN PATENT DOCUMENTS

| | | | |
|---|---|---|---|
| JP | 2001183317 A | | 7/2001 |
| JP | 2001183317 A | * | 7/2001 |
| JP | 2012109171 A | | 6/2012 |
| JP | 2013190315 A | | 9/2013 |
| JP | 2013190315 A | * | 9/2013 |
| JP | 2015159236 A | | 9/2015 |
| JP | 2019128547 A | | 8/2019 |
| JP | 2019128547 A | * | 8/2019 |
| WO | WO-2013063208 A1 | * | 5/2013 ............. H01J 37/16 |
| WO | 2019013633 A1 | | 1/2019 |

* cited by examiner

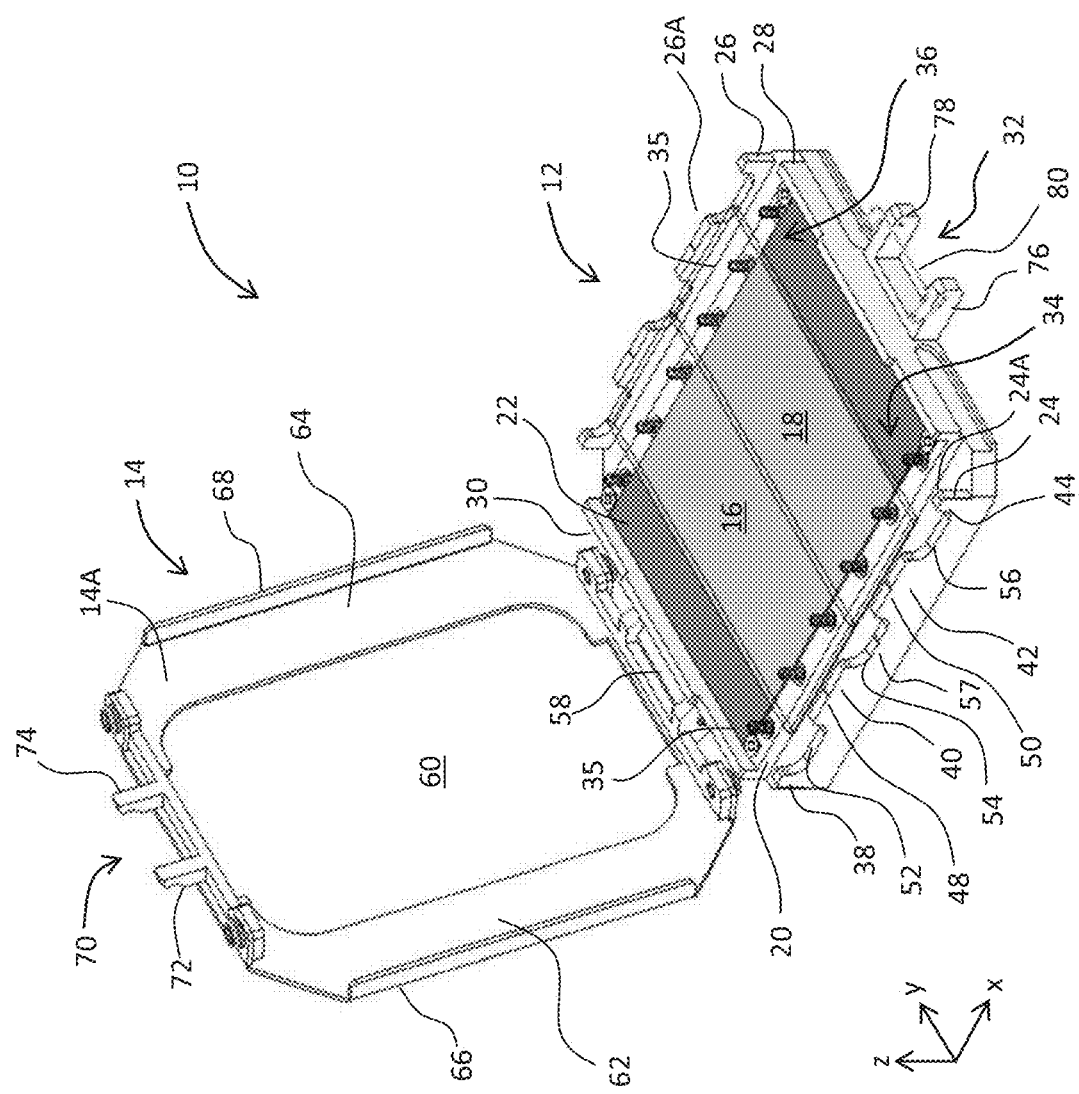

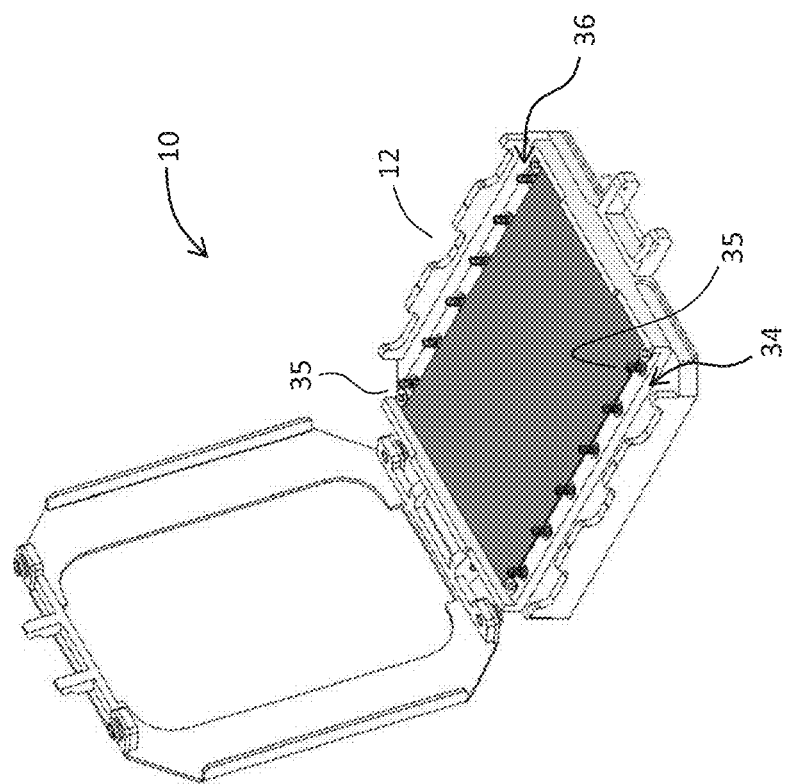

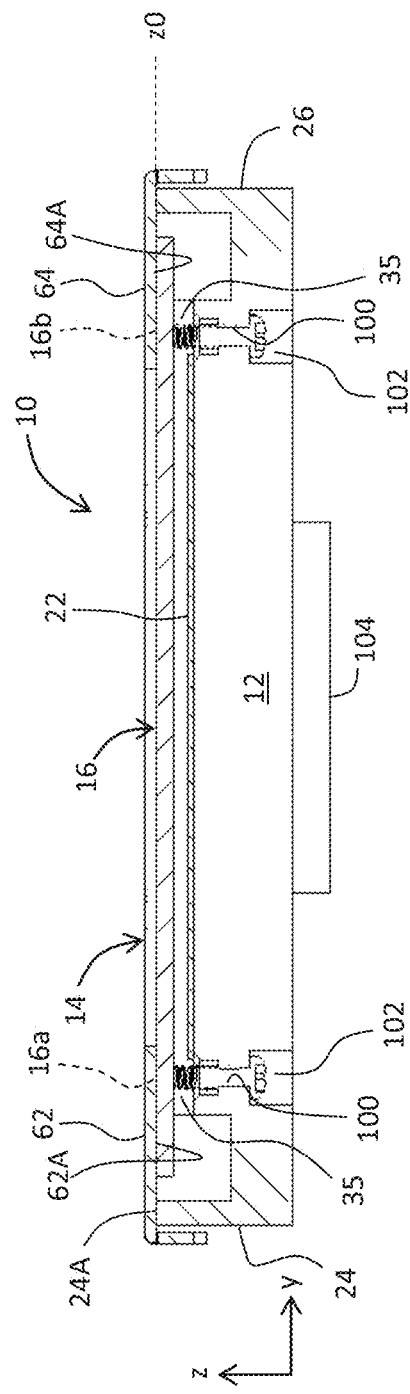

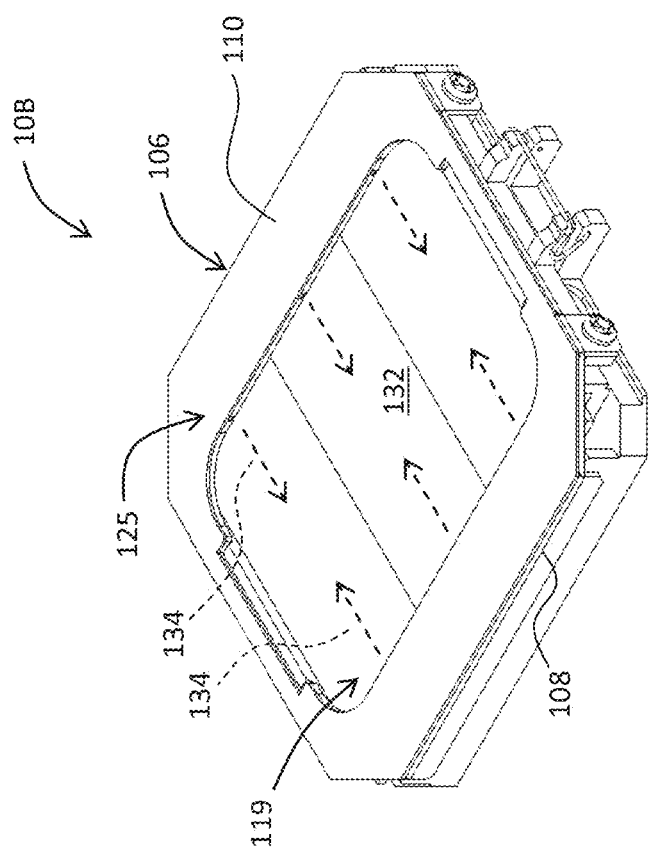

SAMPLE PLATE HOLDER

CROSS REFERENCE TO RELATED APPLICATION

This application claims priority to Japanese Patent Application No. 2019-162089 filed Sep. 5, 2019, the disclosure of which is hereby incorporated by reference in its entirety.

BACKGROUND OF THE INVENTION

Field of the Invention

The present disclosure relates to a sample plate holder, and in particular to a sample plate holder used in a scanning electron microscope.

Description of Related Art

A movable stage is provided inside a sample chamber in a scanning electron microscope. A holder on which a sample to be observed is placed is mounted on the movable stage. When the sample is provided on a sample plate such as a slide glass, a convenient configuration is such that the entirety of the sample plate itself is placed inside the sample chamber and the sample is observed. In particular, desirably, a plurality of sample plates are placed inside the sample chamber so as to enable consecutive observation of a plurality of samples. Realization of a dedicated holder for this purpose is desired. A plurality of types of sample plates having different thicknesses are provided.

JP 2015-159236 A discloses a holder which is placed in a charged particle beam drawing apparatus. This holder holds one glass substrate, and a pressing-up force is applied on the glass substrate from below the glass substrate.

An advantage of the present disclosure lies in realization of a sample plate holder which can hold a plurality of sample plates. Alternatively, an advantage of the present disclosure lies in realization of a sample plate holder which holds the sample plates while aligning upper surface levels of the sample plates at a reference level regardless of the thicknesses of the sample plates.

SUMMARY OF THE INVENTION

According to one aspect of the present disclosure, there is provided a sample plate holder comprising: a holder body that has a storage space which can store m sample plates (wherein m is an integer greater than or equal to 2) arranged in an x direction; a first pressing-up element array provided in the storage space on one side in a y direction orthogonal to the x direction, and formed from a plurality of pressing-up elements arranged in the x direction; a second pressing-up element array provided in the storage space on the other side in the y direction, and formed from a plurality of pressing-up elements arranged in the x direction; and a cover that covers the storage space while exposing a sample region in the storage space, wherein, in a state in which the m or a smaller number of the sample plates are stored in the storage space, pressing-up forces are applied by the first pressing-up element array and the second pressing-up element array on each of the sample plates, so that an upper surface of each of the sample plates is pressed against an inner surface of the cover.

According to the structure described above, one or a plurality of the sample plates are stored in the storage space of the holder body, and are covered by the cover. In an exemplary configuration, the cover has a horizontal orientation in a closed state, and the inner surface thereof forms a horizontal surface. In the closed state of the cover, the pressing-up forces of the first pressing-up element array and the second pressing-up element array are applied on the sample plates, but upward movements of the sample plates are restricted by the cover. In this process, the levels of the upper surfaces of the sample plates are aligned at the level of the inner surface of the cover; that is, a reference level. The levels of the upper surfaces of the sample plates are thus naturally aligned at the reference level regardless of the thicknesses of the sample plates which are being held. With this configuration, during observation under a microscope, a plurality of samples can be consecutively observed with no change of a focus depth or with only a slight change of the focus depth.

According to another aspect of the present disclosure, in the sample plate holder, each of the first pressing-up element array and the second pressing-up element array is formed from the m or more pressing-up elements which operate independently from each other. Each pressing-up element may be formed from a spring, an elastic member, or the like. Because the pressing-up forces are applied on both ends on one side and on the other side of each sample plate, an orientation of each sample plate can be stabilized. In an exemplary configuration, the first pressing-up element array and the second pressing-up element array are provided at positions avoiding the sample region in which the sample may be present, when viewed from above; more specifically, on respective sides of the sample region.

According to another aspect of the present disclosure, in the sample plate holder, m is 3, and each of the first pressing-up element array and the second pressing-up element array is formed from (m×n) pressing-up elements (wherein n is an integer greater than or equal to 1). For example, n is 2. In this case, each pressing-up element array is formed from six pressing-up elements, which are desirably placed with equal spacing.

According to another aspect of the present disclosure, the sample plate holder further comprises: a hinge portion that enables an opening movement and a closing movement of the cover with respect to the holder body; and a lock mechanism that locks the cover with respect to the holder body when the cover is in a closed state. According to this configuration, when the cover is in a closed orientation, a rise of the cover can be prevented.

According to another aspect of the present disclosure, in the sample plate holder, the holder body comprises a first side wall provided on one end in the y direction, and a second side wall provided on the other end in the y direction, an upper surface of the first side wall and an upper surface of the second side wall define a reference level, and, in a closed state of the cover, the inner surface of the cover abuts the upper surface of the first side wall and the upper surface of the second side surface so that an upper surface level of each of the sample plates is aligned at the reference level.

According to another aspect of the present disclosure, in the sample plate holder, a first scale is provided on the first side wall, and a second scale is provided on the second side wall. Each scale corresponds to ticks or an array of markers for positioning. For example, assuming placement of one sample plate, placement of two sample plates, and placement of three sample plates, the first and second scales are provided for defining the position(s) of the sample plate(s).

According to another aspect of the present disclosure, in the sample plate holder, each of the sample plates is transparent, and a background surface having an action to suppress light reflection is provided on a bottom surface of the storage space. According to this configuration, visual inspection and observation of the sample on each of the sample plate can be facilitated.

According to another aspect of the present disclosure, in the sample plate holder, a flow path structure for blowing gas onto upper surfaces of the m or a smaller number of the sample plates stored in the storage space is provided on at least one of the holder body or the cover. For example, when setting the sample region as a low-vacuum region is desired, gas is blown to the sample region. According to another aspect of the present disclosure, in the sample plate holder, the cover has an observation window, and an electrically conductive mesh is provided on the observation window. According to this configuration, an electric field around the sample can be stabilized, and accumulation of charges can be prevented.

According to another aspect of the present disclosure, in the sample plate holder, each of the holder body and the cover is formed from an electrically conductive material, a terminal for voltage application is provided on one of the holder body or the cover, and an engagement block formed from an insulating material and which is to be combined to a movable stage is provided on the holder body. According to this configuration, an electrical potential of the holder as a whole can be controlled. According to another aspect of the present disclosure, in the sample plate holder, one or a plurality of positioning marks are provided on the cover. The positioning marks may be used in positioning the sample plate holders.

BRIEF DESCRIPTION OF THE DRAWINGS

Embodiment(s) of the present disclosure will be described based on the following figures, wherein:

FIG. 1 is a perspective diagram showing an open state of a sample plate holder according to a first embodiment of the present disclosure;

FIG. 4 is a perspective diagram showing an initial state of the sample plate holder according to the first embodiment of the present disclosure;

FIG. 5 is a cross-sectional diagram showing the sample plate holder according to the first embodiment of the present disclosure;

FIG. 9 is a perspective diagram showing the sample plate holder according to the third embodiment of the present disclosure;

DESCRIPTION OF THE INVENTION

Figure 3:
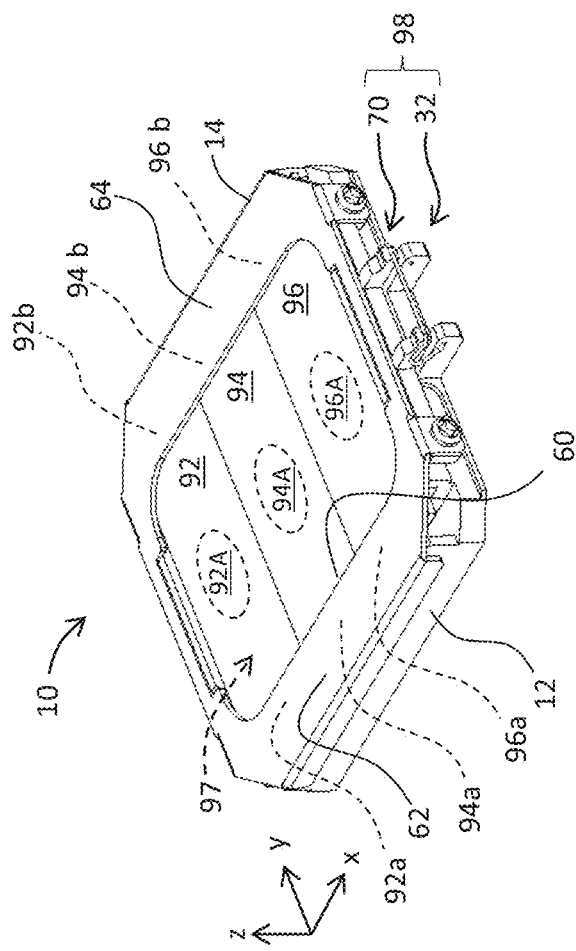
FIG. 3 is a perspective diagram showing a closed state of the sample plate holder according to the first embodiment of the present disclosure.

Embodiments of the present disclosure will now be described with reference to the drawings.

FIGS. 1 to 5 show a sample plate holder according to a first embodiment of the present disclosure. The sample plate holder is specifically a slide glass holder for sample observation, and is placed in a sample chamber of a scanning electron microscope. The sample to be observed is, for example, pre-processed fine particles. Alternatively, fine particles including asbestos or a biological tissues in a segmented form may be set as the observation target. Alternatively, other samples may be set as the observation target.

In FIG. 1, a sample plate holder 10 comprises a holder body 12 and a cover 14. Each of these elements is formed from, for example, a metal such as stainless steel or aluminum. Alternatively, these elements may be formed from other materials. In FIG. 1, an x direction is a first horizontal direction, a y direction is a second horizontal direction, and a z direction is a vertical direction. These three directions are orthogonal to each other. When the sample plate holder 10 is mounted on a movable stage in the sample chamber, an orientation of the sample plate holder 10 may vary depending on an orientation of the movable stage. The first horizontal direction, the second horizontal direction, and the vertical direction described above are defined assuming a case in which the sample plate holder 10 is mounted on a horizontal surface and has a basic orientation.

The holder body 12 has a base 20 which is a horizontal plate. A thin background plate 22 is provided on an upper surface of the base 20. The background plate 22 is formed from a material which reduces or suppresses reflection of light, or a treatment for reducing or suppressing the reflection of light is applied on a surface of the background plate 22. Example of this treatment include plating (for example, chrome plating), rough surface machining, coloring, and the like.

The holder body 12 has side plates 24 and 26 respectively provided on one end and on the other end in the y direction. The side plates 24 and 26 have an upstanding, plate-shape form. In addition, the holder body 12 has a front plate 28 and a back plate 30 provided respectively on one end (front end) and on the other end (back end) in the x direction. The front and back plates also have an upstanding, plate-shape form.

The inside of the holder body 12; more specifically, a space above the background plate 22 and surrounded by the four plates 24, 26, 28, and 30, is a storage space, and one or a plurality of sample plates are stored and placed in the storage space. In FIG. 1, two sample plates 16 and 18 are placed in the storage space. The sample plates 16 and 18 are slide glasses having transparency, and samples are placed on upper surfaces thereof. In FIG. 1, illustration of the sample is omitted.

On an upper surface of each of the sample plates 16 and 18, a portion other than the ends in the y direction and sides parallel to the y direction is an individual sample region. An overall sample region is conceptualized as a region including all of a plurality of the individual sample regions on the plurality of sample plates 16 and 18. The y direction corresponds to a long-length direction of each of the sample plates 16 and 18, and the x direction corresponds to a short-length direction of each of the sample plates 16 and 18.

In the holder body 12, on one side in the y direction; more specifically, near the side plate 24, there is provided a spring array 34 which functions as a first pressing-up element array. In the illustrated example configuration, the spring array 34 is formed from six springs 35 arranged in a straight line shape with equal spacing. In the holder 12, on the other side in the y direction; more specifically, near the side plate 26, there is provided a spring array 36 which functions as a second pressing-up element array. Similar to the spring array 34, the spring array 36 is formed from six springs 35 arranged in a straight line shape with equal spacing. Each spring 35 applies a pressing-up force as an elastic force or an urging force on a sample plate contacting the spring 35. Alternatively, in place of the plurality of springs 35, a plurality of elastic elements may be used.

When a maximum number of the sample plates arranged in the x direction is m, and n springs are provided on each of left and right sides for each sample plate in a state in which the m sample plates are arranged, each of the spring arrays 34 and 36 is formed from (m×n) springs 35. Here, m is an integer greater than or equal to 2, and n is an integer greater than or equal to 1. In the illustrated example configuration, m is 3 and n is 2.

In the configuration exemplified in FIG. 1, two sample plates 16 and 18 are placed in the storage space. The sample plates 16 and 18 contact each other at an intermediate position in the x direction. In this case, each end of the sample plates 16 and 18 is supported by two springs. In a case in which three sample plates are provided in the storage space, each of the ends of the sample plates is supported by two springs. When one sample plate is provided in the storage space; more specifically, when the sample plate is provided at an intermediate position in the x direction, each end of the sample plate is supported by two springs.

In any of these cases, each sample plate is stably supported. In other words, two spring arrays 34 and 36 are configured such that the sample plates can be stably supported regardless of the number of sample plates to be held.

The side plate 24 and the side plate 26 have the same form or forms that are symmetric with each other, and the form of the side plate 24 will be described herein as a representative side plate. The side plate 24 has an upper surface 24A which defines a reference level. The side plate 26 has a similar upper surface 26A. The side plate 24 has a plurality of projections 38, 40, 42, and 44 arranged in the x direction. Between two adjacent projections 38, 40, 42, and 44, recesses 52, 54, and 56 are provided. On upper surfaces of the projections 40 and 42, markers 48 and 50 are provided. When three sample plates are placed, markers 48 and 50 show inter-sample-plate positions. When two sample plates are placed, the markers 48 and 50 show center positions of the sample plates. When one sample plate is placed, the markers 48 and 50 show ends in the x direction of the sample plate. On the recess 54, a marker 57 showing an intermediate position in the x direction is provided.

Each of the markers 48, 50, and 57 is a line or a groove parallel to the y direction. The plurality of recesses 52, 54, and 56 also function as grooves into which a fingertip or a tool such as a forceps is inserted. As described above, the side plate 26 has a form similar to that of the side plate 24. Each of the plurality of projections 38, 40, 42, and 44, each of the plurality of recesses 52, 54, and 56, and each of the plurality of markers 48, 50, and 57 provided on the side plates 24 and 26 functions as a scale element. That is, as a whole, these elements function as a scale.

On a front side of the holder body 12, a lower engagement portion 32 is provided. In the illustrated example configuration, the lower engagement portion 32 is formed from two protrusions 76 and 78, and a locking metal fitting 80.

The cover 14 is rotatably held by a hinge portion 58 provided on the holder body 12. In FIG. 1, the cover 14 has an open orientation. That is, the sample plate holder 10 is in an open state. The cover 14 has an observation window 60 serving as a quadrangular opening. The cover 14 has a form surrounding the observation window 60, and more specifically has an edge portion 62 provided on one side in the y direction and an edge portion 64 provided on the other side in the y direction of the observation window 60.

The two edge portions 62 and 64 are flat plates, and function as plate end pressing pieces. A folding piece 66 is provided as a portion continuous from the edge portion 62, and a folding piece 68 is provided as a portion continuous from the edge portion 64. The cover 14 has an upper engagement portion 70, which is formed from two protrusions 72 and 74.

When the cover 14 is in the open orientation and the sample plate holder 10 is in the open state, the sample plates 16 and 18 in the storage space are in a state in which the plates are pressed from below up to an uppermost level while being supported by the plurality of springs 35 immediately below the sample plates. When the cover 14 is changed from the open orientation to a closed orientation, and the sample plate holder 10 is changed to a closed state, an inner surface (back surface) 14A of the cover 14 presses the ends of the plurality of sample plates 16 and 18 downward. The downward movement of the cover 14 is restricted when the inner surface 14A of the cover 14 abuts the upper surfaces 24A and 26A of the two side plates 24 and 26. In this state, ends on the upper surfaces of the plurality of sample plates 16 and 18 are in close contact with the inner surface 14A of the cover 14, and the plurality of sample plates 16 and 18 are sandwiched between the plurality of springs 35 and the cover 14.

In this process, upper surface levels of the sample plates 16 and 18 are aligned with an inner surface level of the cover 14; that is, a level (reference level) of the upper surfaces of the two side plates 24 and 26. Even when the plurality of sample plates 16 and 18 differ in thickness, the upper surface levels of the sample plates are always aligned at the reference level.

In the closed orientation of the cover 14, a locked state is formed by the lower engagement portion 32 and the upper engagement portion 70. Specifically, the metal fitting 80 attached to the two protrusions 76 and 78 is hooked to the two protrusions 72 and 74. This operation is performed by a user, but alternatively, a configuration may be employed in which the locked state is automatically formed during a closing operation.

Figure 2:
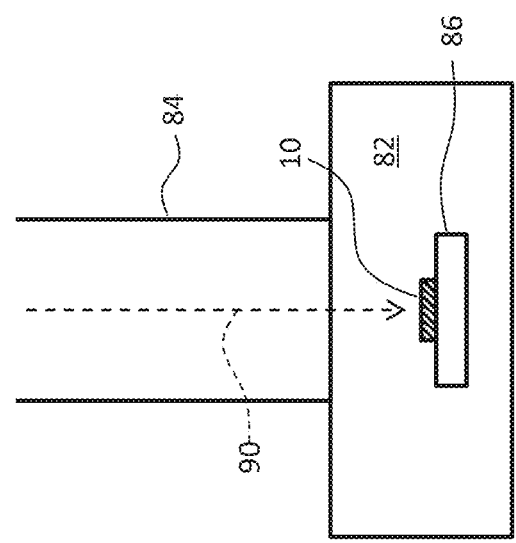
FIG. 2 is a schematic diagram showing a state in which a sample plate holder is mounted on a stage.

FIG. 2 schematically shows a portion of a scanning electron microscope. The scanning electron microscope has a sample chamber 82 and a lens barrel 84. Reference numeral 90 shows an electron beam. In the sample chamber 82, a movable stage (sample stage) 86 is provided. A controller (not shown) controls a position and an orientation of the movable stage 86. The sample plate holder 10 is mounted on the movable stage 86.

FIG. 3 shows the sample plate holder 10 in a closed state. That is, the holder body 12 is covered by the cover 14. FIG. 3 shows a configuration in which three sample plates 92, 94, and 96 are held. Respective ends 92a, 92b, 94a, 94b, 96a, and 96b of the sample plates 92, 94, and 96 are pressed down by the two edge portions 62 and 64 of the cover 14. An overall sample region 97 including all of three individual sample regions 92A, 94A, and 96A is exposed through the observation window 60. A lock mechanism 98 is formed by the lower engagement portion 32 and the upper engagement portion 70.

FIG. 4 shows the sample plate holder 10 in an open state. FIG. 4 shows an initial state in which no sample plate is mounted. Each of the spring arrays 34 and 36 provided on the holder body 12 is formed from six springs 35.

FIG. 5 shows a yz cross section of the sample plate holder 10. As already described, the sample plate holder 10 comprises the holder body 12, and the cover 14 covering the holder body 12. The inner surface of the cover 14 abuts the upper surfaces 24A and 26A of the two side plates 24 and 26. Pressing-up forces are applied from the plurality of springs 35 on the sample plate 16, but the ends 16a and 16b of the sample plate 16 are in contact with inner surfaces 62A and 64A of the two edge portions 62 and 64, and a further rise of the sample plate 16 is thus restricted.

A plurality of holes 100 are formed on the holder body 12, and a plurality of screw members 102 are inserted into the plurality of holes 100. The plurality of springs 35 are attached on upper ends of the plurality of screw members 102. In FIG. 5, z0 shows the reference level, which is aligned with the inner surface level of the cover and the upper surface level of the side plate.

As described, according to the sample plate holder of the present embodiment, the upper surface levels of the sample plates can be naturally aligned at the reference level regardless of the thicknesses of the sample plates. Therefore, there can be obtained an advantage in that the focus depth does not need to be changed, or needs to be changed only slightly according to the thickness of the sample plate. In addition, there can be obtained another advantage in that a plurality of sample plates can be simultaneously held and simultaneously set inside the sample chamber, and a plurality of samples can be consecutively observed. In this process also, the focus depth does not need to be changed or needs to be changed only slightly according to the thickness of the sample plate. In the sample plate holder according to the present embodiment, regardless of the number of sample plates which are placed thereon, each of the ends of each sample plate is stably supported by two springs. On each side plate, a structure which functions as a scale is provided, and the sample plates can be accurately placed using the scale as a guide. In addition, because a treatment to suppress the light reflection is applied on the surface of the background plate, visibility of the sample plate and the sample can be improved.

Figure 7:
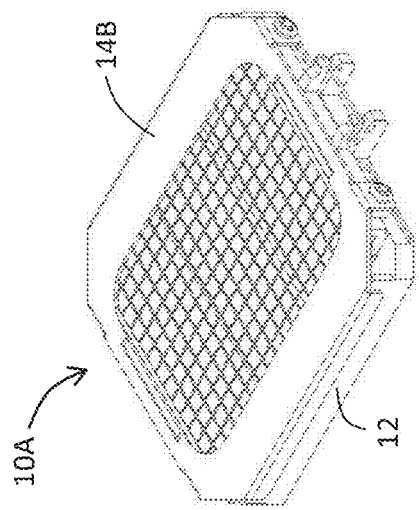
FIG. 7 is a perspective diagram showing a closed state of the sample plate holder according to the second embodiment of the present disclosure.
Figure 6:
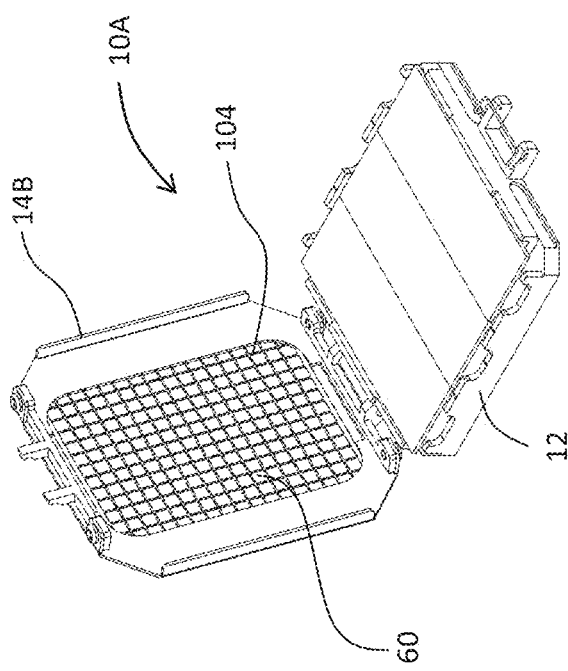
FIG. 6 is a perspective diagram showing an open state of a sample plate holder according to a second embodiment of the present disclosure.

FIGS. 6 and 7 show a sample plate holder 10A according to a second embodiment of the present disclosure. In FIG. 6, the sample plate holder 10A comprises the holder body 12 and a cover 14B. The cover 14B has the observation window 60, and a metal mesh 104 is provided on the observation window 60. The entirety of the sample plate holder 10A is formed from an electrically conductive material. FIG. 7 shows the sample plate holder 10A in a closed state. The body 12 is covered by the cover 14B. According to the second embodiment of the present disclosure, advantages can be obtained, in electron microscope observation, in that an electric field around the sample can be stabilized and in that charging of the sample can be prevented.

Figure 8:
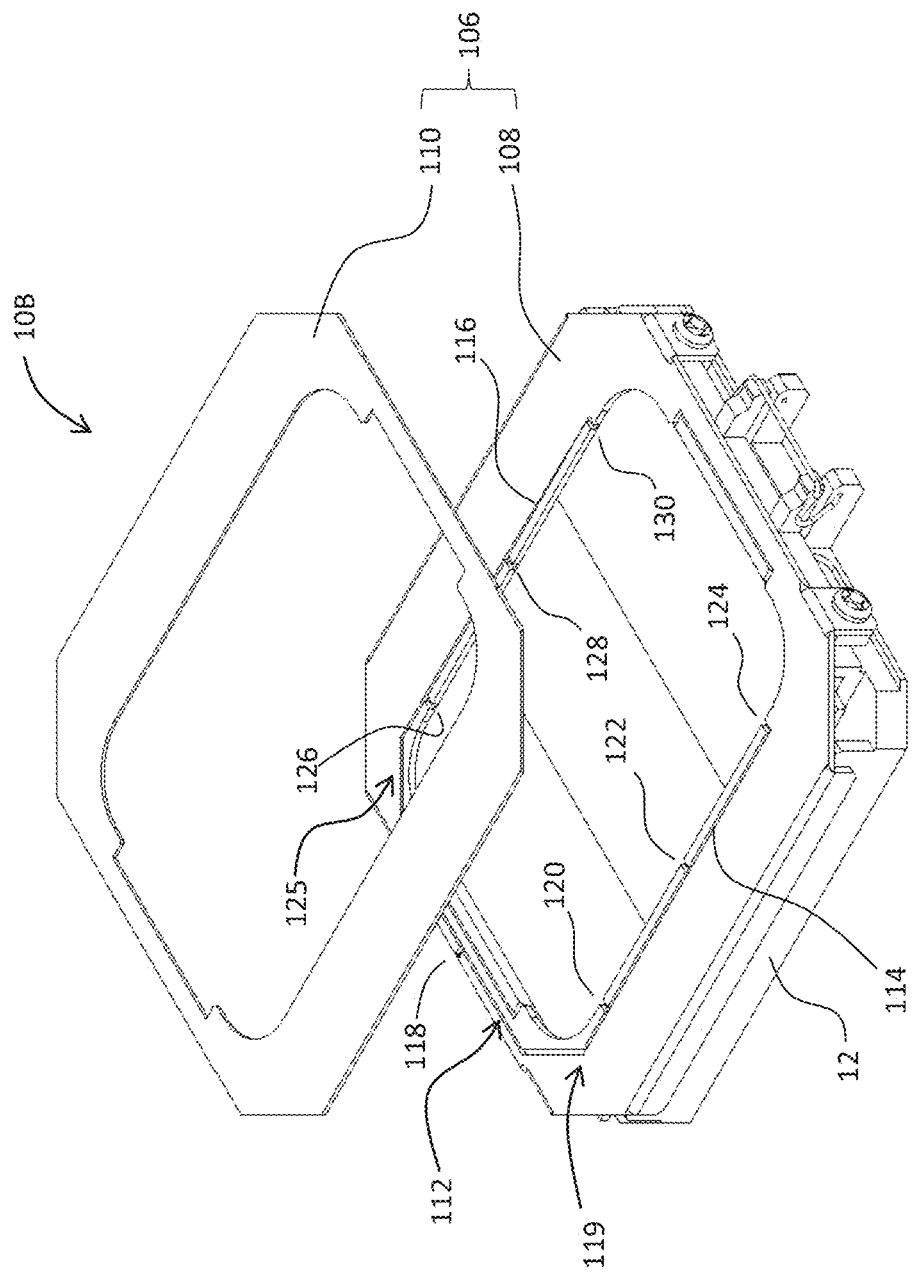
FIG. 8 is an exploded perspective diagram showing a sample plate holder according to a third embodiment of the present disclosure.

FIGS. 8 and 9 show a sample plate holder 10B according to a third embodiment of the present disclosure. In FIG. 8, the sample plate holder 10B comprises the holder body 12 and a cover 106. The cover 106 is formed from a lower cover 108 and an upper cover 110. In FIG. 8, for the purpose of explanation, the lower cover 108 and the upper cover 110 are illustrated in a separated state.

A flow path structure 112 is formed on the lower cover 108. The flow path structure 112 has gas flow paths 114 and 116, and also has a gas introduction port 118, and a plurality of gas ejection ports 120, 122, 124, 126, 128, and 130. The gas ejection ports form two gas ejection port arrays.

In FIG. 9, the lower cover 108 and the upper cover 110 are combined. Gas is sent from two gas ejection port arrays 119 and 125 formed on the cover 106 to a sample region 132 (refer to reference numeral 134). With this process, the sample can be set under a low-vacuum environment. That is, the inside of the sample chamber is generally set in high vacuum, and gas is locally sent so that the portion is set to low vacuum. As the gas, air, nitrogen, or the like may be used. This configuration can be applied to various sample plate holders.

Figure 10:
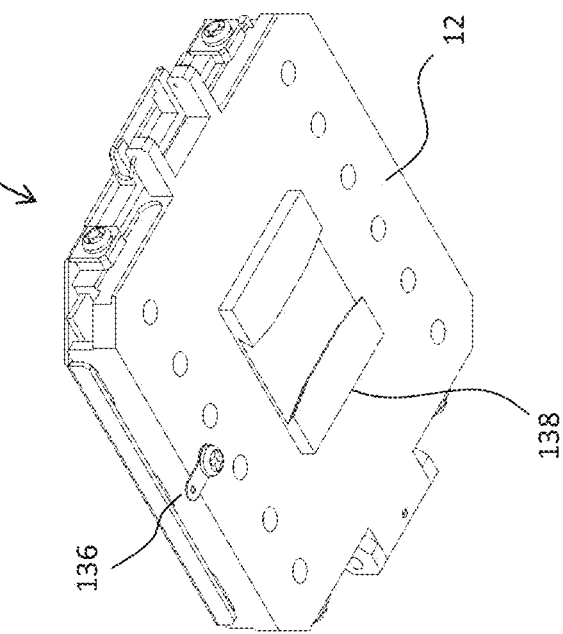
FIG. 10 is a perspective diagram showing a sample plate holder according to a fourth embodiment of the present disclosure.

FIG. 10 shows a sample plate holder 10C according to a fourth embodiment of the present disclosure. On a lower surface of the holder body 12, a combining block 138 formed form an insulating material is provided. The combining block 138 is a portion to be connected to the movable stage. On the lower surface of the body 12, a terminal 136 is provided. The entirety of the sample plate holder 10C is formed from an electrically conductive material. A signal line is connected to the terminal 136, and a voltage is applied thereon, so that the sample plate holder, and consequently, the sample, can be set at a desired electrical potential.

Figure 11:
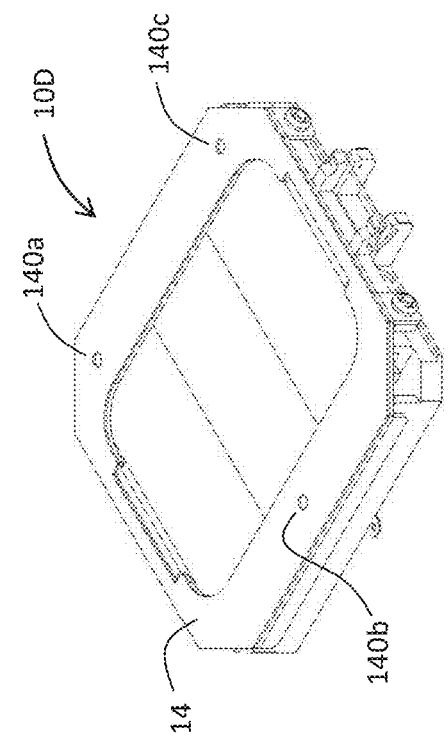
FIG. 11 is a perspective diagram showing a sample plate holder according to a fifth embodiment of the present disclosure.

FIG. 11 shows a sample plate holder 10D according to a fifth embodiment of the present disclosure. On an upper surface of the cover 14, a plurality of alignment marks 140a, 140b, and 140c are formed. During observation under an optical microscope or observation under an electron microscope, the sample plate holder 10D can be positioned by reference to the alignment marks 140a, 140b, and 140c.

The invention claimed is:

1. A sample plate holder for use with a scanning electron microscope (SEM) comprising:

a holder body that has a storage space configured to store m sample plates arranged in an x direction, wherein m is an integer greater than or equal to 2, wherein a sample is placed on an upper surface of each of the sample plates, wherein each of the sample plates is transparent, and wherein a background surface is provided on a bottom surface of the storage space, the background surface at least one of: is formed of a material which suppresses light reflection and has a treatment applied thereto to suppress light reflection;

a first pressing-up element array provided in the storage space on one side in a y direction orthogonal to the x direction, and formed from a plurality of pressing-up elements arranged in the x direction;

a second pressing-up element array provided in the storage space on another side in the y direction, and formed from a plurality of pressing-up elements arranged in the x direction; and a cover that covers the storage space while exposing a sample region in the storage space, wherein the storage space is an inside space of the holder body, the first pressing-up element array and the second pressing-up element array are provided at the holder body, the sample plates are arranged with their longitudinal direction parallel to the y-direction, each of the sample plates comprises a first end and a second end away from each other in the longitudinal direction, in a state in which the m or a smaller number of the sample plates are stored in the storage space, the first end of each of the sample plates is supported by the plurality of pressing-up elements in the first pressing-up element array and the second end of each of the sample plates is supported by the plurality of pressing-up elements in the second pressing-up element array, and pressing-up forces are applied by the first pressing-up element array and the second pressing-up element array on each of the sample plates, so that an upper surface of each of the sample plates is pressed against an inner surface of the cover, no pressing up elements are provided below the sample plates between the first pressing-up element array and the second pressing-up element array, and when the cover is in a closed state, the first pressing-up element array and the second pressing-up element array are covered by the cover.

2. The sample plate holder according to claim 1, wherein each of the first pressing-up element array and the second pressing-up element array is formed from (m×n) pressing-up elements which operate independently from each other, where n is an integer greater than or equal to 2.

3. The sample plate holder according to claim 2, wherein the pressing-up elements are springs, and m is 3.

4. The sample plate holder according to claim 1, further comprising:
a hinge portion configured to enable an opening movement and a closing movement of the cover with respect to the holder body; and
a lock mechanism that locks the cover with respect to the holder body when the cover is in a closed state.

5. The sample plate holder according to claim 1, wherein the holder body comprises:
a first side wall provided on one end in the y direction; and
a second side wall provided on another end in the y direction,
an upper surface of the first side wall and an upper surface of the second side wall define a reference level, and
in a closed state of the cover, the inner surface of the cover abuts the upper surface of the first side wall and the upper surface of the second side wall so that an upper surface level of each of the sample plates is aligned at the reference level.

6. The sample plate holder according to claim 5, wherein a first scale is provided on the first side wall, and a second scale is provided on the second side wall.

7. The sample plate holder according to claim 1, wherein a flow path structure for blowing gas onto upper surfaces of the m or a smaller number of the sample plates stored in the storage space is provided on at least one of the holder body or the cover.

8. The sample plate holder according to claim 1, wherein the cover has an observation window, and
an electrically conductive mesh is provided on the observation window.

9. The sample plate holder according to claim 1, wherein each of the holder body and the cover is formed from an electrically conductive material,
a terminal for voltage application is provided on one of the holder body or the cover, and
an engagement block formed from an insulating material and which is to be combined to a movable stage is provided on the holder body.

10. The sample plate holder according to claim 1, wherein one or a plurality of positioning marks are provided on the cover.

* * * * *